(12) United States Patent
Huang et al.

(10) Patent No.: US 9,581,939 B2
(45) Date of Patent: Feb. 28, 2017

(54) DEVELOPING DEVICE AND DEVELOPING METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Changgang Huang, Beijing (CN); Hongjiang Wu, Beijing (CN); Gyuhyun Lee, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/421,726

(22) PCT Filed: Aug. 7, 2013

(86) PCT No.: PCT/CN2013/080971
§ 371 (c)(1),
(2) Date: Feb. 13, 2015

(87) PCT Pub. No.: WO2014/205889
PCT Pub. Date: Dec. 31, 2014

(65) Prior Publication Data
US 2015/0234326 A1  Aug. 20, 2015

(30) Foreign Application Priority Data

Jun. 25, 2013 (CN) .......................... 2013 1 0255986

(51) Int. Cl.
*G03F 7/32* (2006.01)
*G03G 15/10* (2006.01)

(52) U.S. Cl.
CPC ................................. *G03G 15/104* (2013.01)

(58) Field of Classification Search
USPC ............................. 396/611, 625, 627; 118/53
See application file for complete search history.

(56) References Cited

U.S. PATENT DOCUMENTS

| 5,766,354 A | * | 6/1998 | Ohmori | ................... B05C 11/08 118/319 |
| 6,851,873 B2 | * | 2/2005 | Muraoka | ................... B08B 3/02 134/1 |
| 2002/0084389 A1 | * | 7/2002 | Larson | ..................... A47B 9/20 248/188.1 |

FOREIGN PATENT DOCUMENTS

| CN | 1051458 A | 5/1991 |
| CN | 1392454 A | 1/2003 |

(Continued)

OTHER PUBLICATIONS

JP2006/013156 English Machine Translation available from JPO.*

(Continued)

*Primary Examiner* — Minh Phan
(74) *Attorney, Agent, or Firm* — Harness, Dickey & Pierce, P.L.C.

(57) ABSTRACT

The present disclosure provides a developing device and method. The developing device includes the nozzle for spraying the developing liquid, the machine table for bearing the glass substrate, and the inclination controller for controlling the nozzle and the machine table to be inclined towards a predetermined direction of the machine table at a predetermined angle and keeping the inclined angle within a preset period. The method includes controlling, by the inclination controller, the machine table and the nozzle to be inclined towards a first direction of the machine table at a predetermined angle during the inclination cycle period and keeping the inclined angle within the preset period, and controlling, by the inclination controller, the machine table and the nozzle to be sequentially inclined towards other (Continued)

directions of the machine table at a predetermined angle according to the preset inclination direction sequence and keeping the inclined angle within the preset period.

14 Claims, 6 Drawing Sheets

(56) References Cited

FOREIGN PATENT DOCUMENTS

| CN | 1722361 A | 1/2006 |
|---|---|---|
| CN | 1725074 A | 1/2006 |
| CN | 1992158 A | 7/2007 |
| CN | 101114578 A | 1/2008 |
| CN | 202712144 U | 1/2013 |
| CN | 103207543 A | 7/2013 |
| JP | 2002184685 A | 6/2002 |
| JP | 2003122021 A | 4/2003 |
| JP | 2006013156 A * | 1/2006 |
| JP | 2007286398 A | 11/2007 |
| JP | 2008028247 A * | 2/2008 |
| KR | 20060007187 A * | 1/2006 |

OTHER PUBLICATIONS

JP2008/028247 English Machine Translation available from JPO.*
KR01-2006-0007187 English Machine Translation available from K-PION.*
Third Office Action regarding Chinese application No. 201310255986.2, dated Aug. 26, 2015. Translation provided by Dragon Intellectual Property Law Firm.
International Search Report dated Apr. 3, 2014 regarding PCT/CN2013/080971.
Chinese Office Action dated Sep. 29, 2014 regarding Chinese Application No. 201310255986.2. Translation provided by Dragon Intellectual Property Law Firm.

* cited by examiner

DEVELOPING DEVICE AND DEVELOPING METHOD

CROSS-REFERENCE TO RELATED APPLICATIONS

The present application is the U.S. national phase of PCT Application No. PCT/CN2013/080971 filed on Aug. 7, 2013, which claims a priority of the Chinese patent application No. 201310255986.2 filed on Jun. 25, 2013, which is incorporated herein by reference in its entirety.

TECHNICAL FIELD

The present disclosure relates to the field of liquid crystal display panel production technology, in particular to a developing device and a developing method.

BACKGROUND

During the production of a thin film transistor liquid crystal display (TFT-LCD), a photoresist coated on a glass substrate needs to be developed after exposure to obtain a desired pattern.

As shown in FIGS. 1 and 2, in a developing device for an advanced-generation production line, a glass substrate 3 is provided in a developing trough at a certain inclination angle (θ) relative to a machine table 1, with its inclination direction and angle being kept the same. An inclination direction and an inclination angle of a nozzle 2 for spraying a developing liquid are consistent with those of the glass substrate 3. The developing liquid contacted by the glass substrate 3 positioned at an upper portion of an inclination surface (side a-a of the glass substrate 3 in FIG. 1) during the development is new liquid sprayed via the nozzle 2, and has a constant concentration. The concentration of the developing liquid becomes low after reacting with the photoresist and flows toward a lower portion of the inclination surface (side b-b of the glass substrate 3 in FIG. 1), resulting in that the concentration of the developing liquid contacted by the glass substrate 3 at the lower portion of the inclination surface (side b-b of the glass substrate 3 in FIG. 1) is lower than that contacted by the glass substrate at the upper portion. A line width of glass inclination surface at the upper portion (i.e., side a-a) is narrower than that at the lower portion (i.e., side b-b), thereby the line width uniformity of the whole glass substrate is adversely affected; for example, line width m<line width n as shown in FIG. 3.

As shown in FIG. 4, there currently is another developing method in which the development is performed in such a way that the machine table 1 drives glass substrate 3 to rotate, but this method is not applicable to the advanced-generation production line because the glass substrate 3 for the advanced-generation production line has a particularly large size and fragments may be produced during the rotation.

Therefore, for the advanced-generation production, some film layers (such as a black matrix of a color filter substrate and respective film layers of an array substrate) require high line width uniformity, and there is a need to find a developing device, which is capable of providing better line width uniformity, for the development.

SUMMARY

The present disclosure provides a developing device and a developing method, so as to ensure a consistent concentration of a developing liquid contacted by a glass substrate in respective directions, thereby to improve line width uniformity after the development.

An embodiment of the present disclosure provides a developing device, comprising:
 a nozzle for spraying a developing liquid;
 a machine table for bearing a glass substrate; and
 an inclination controller for controlling the nozzle and the machine table to be inclined toward a predetermined direction of the machine table at a predetermined angle, and keeping the inclined angle within a preset period.

Alternatively, the inclination controller comprises a telescopic member connected with the nozzle and the machine table, respectively.

Alternatively, the inclination controller comprises four telescopic members connected with the nozzle and the machine table at preset positions, respectively.

Alternatively, the preset positions are corners of the nozzle and the machine table.

Alternatively, a center of the glass substrate is aligned with a center of the machine table.

Alternatively, the inclination controller comprises a swinging member fixedly connected with the machine table.

Alternatively, the nozzle is fixedly connected with the machine table via a connecting member.

Another embodiment of the present disclosure further provides a developing method, comprising:
 controlling, by an inclination controller, a machine table and a nozzle to be inclined toward a first direction of the machine table at a predetermined angle during an inclination cycle period, and keeping the inclined angle within a preset period; and
 controlling, by the inclination controller, the machine table and the nozzle to be sequentially inclined toward other directions of the machine table at a predetermined angle according to a preset inclination direction sequence, and keeping the inclined angle within a preset period.

Alternatively, the developing method further comprising:
 setting the inclination cycle period according to process requirements.

Alternatively, the developing method further comprising:
 continuously spraying, by the nozzle, a developing liquid during the inclination cycle period.

Alternatively, the developing method further comprising:
 intermittently spraying, by the nozzle, the developing liquid during the inclination cycle period.

Alternatively, the developing method further comprising:
 spraying, by the nozzle, the developing liquid in such a manner as to cover a glass substrate completely.

As can be seen from the above description, according to the present disclosure, the developing device includes the nozzle for spraying the developing liquid, the machine table for bearing the glass substrate, and the inclination controller for controlling the nozzle and the machine table to be inclined towards a predetermined direction of the machine table at a predetermined angle and keeping the inclined angle within a preset period. The developing method includes controlling, by the inclination controller, the machine table and the nozzle to be inclined towards a first direction of the machine table at a predetermined angle during the inclination cycle period and keeping the inclined angle within the preset period, and controlling, by the inclination controller, the machine table and the nozzle to be sequentially inclined towards other directions of the machine table at a predetermined angle according to the preset inclination direction sequence and keeping the inclined angle within the preset period. As a result, it is able to ensure the consistent concentration of the developing liquid contacted by the glass substrate in respective directions, thereby to improve the line width uniformity after the development.

DETAILED DESCRIPTION

To make the objects, the technical solutions and the advantages of the embodiments of the present disclosure more apparent, the technical solution thereof will be described hereinafter in a clear and complete manner in conjunction with the drawings. Obviously, the following embodiments are merely a part of, rather than all of, the embodiments of the present disclosure. Any other embodiments obtained by an ordinary person skilled in the art without any creative effort on the basis of the embodiments of the present disclosure also fall into the protection scope of the present disclosure.

Unless otherwise specified, the technical terms or scientific terms used herein shall be understood in a usual sense by a person having an ordinary skill in the art. "First", "second", and the like used in the specification and claims of the present disclosure do not indicate any order, number or importance, but are merely used to distinguish different constituent parts. Likewise, "a", "one" and the like are not used to limit the number, but are used to indicate the existence of at least one. "Connection", "interconnection" and the like are not limited to physical connection or mechanical connection, but may include electrical connection, whether directly or indirectly. "Up", "down", "left", "right" and the like are merely used to indicate a relative position relation, and when an absolute position of an object to be described changes, the relatively positional relation changes accordingly.

Figure 1:
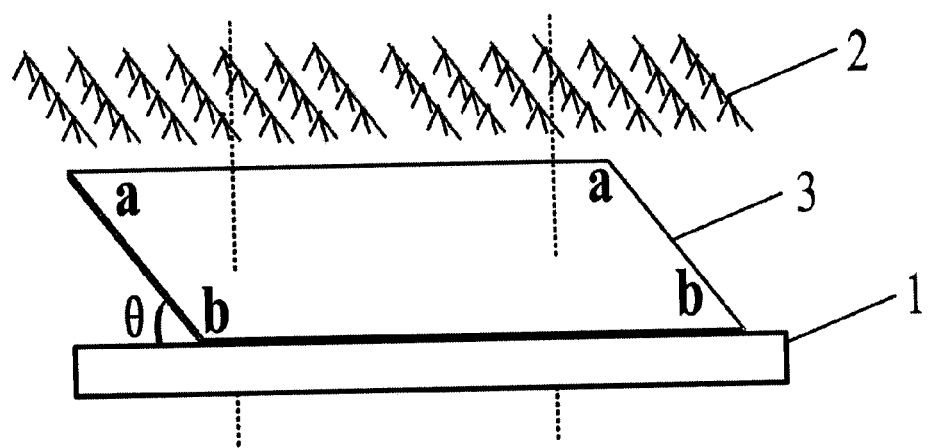
FIG. 1 is a schematic view showing the prior art.
Figure 2:
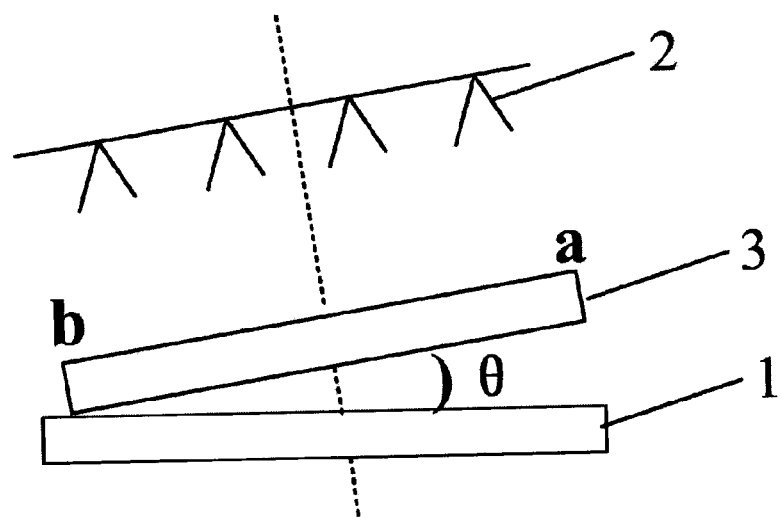
FIG. 2 is another schematic view showing the prior art.
Figure 3:
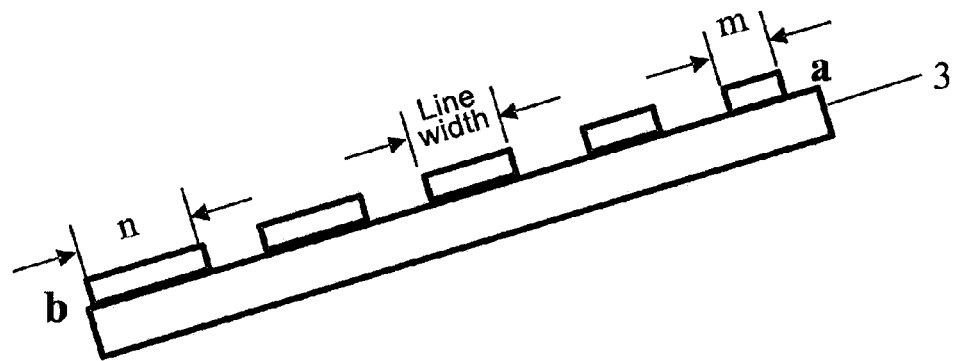
FIG. 3 is yet another schematic view showing the prior art.
Figure 4:
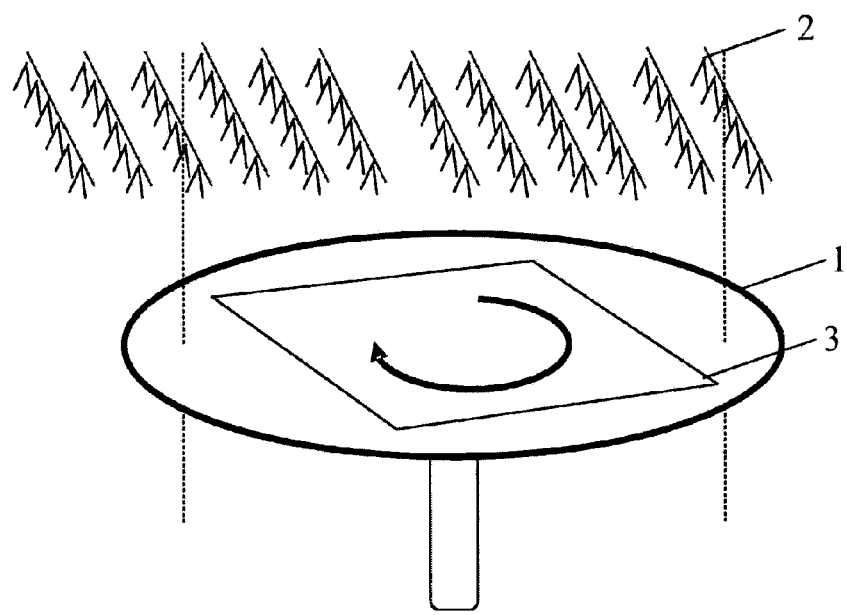
FIG. 4 is still yet another schematic view showing the prior art.
Figure 5:
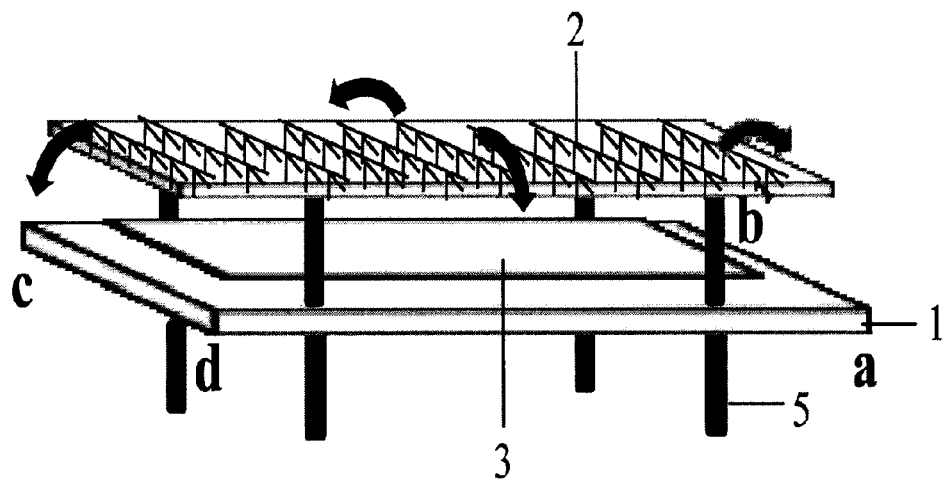
FIG. 5 is a schematic view showing a structure of a developing device according to an embodiment of the present disclosure.

An embodiment of the present disclosure provides a developing device. As shown in FIG. 5, the developing device may specifically include:

a nozzle 2 for spraying a developing liquid;

a machine table 1 for bearing a glass substrate 3; and an inclination controller for controlling the nozzle 2 and the machine table 1 to be inclined toward a predetermined direction of the machine table 1 at a predetermined angle, and keeping the inclined angle within a preset period.

According to the developing device provided in the embodiment of the disclosure, the inclination controller controls the machine table 1 to drive the developing liquid nozzle 2 and the glass substrate 3 to be inclined and swung toward respective directions of the machine table 1 (for example, directions towards its four sides) with its center (or the center of the glass substrate 3) as a reference in a certain inclination cycle period, so as to complete the development. According to the developing device, it is able to ensure the consistent concentration of the developing liquid contacted by each part of the glass substrate 3, thereby to improve the line width uniformity after the development.

In a preferred embodiment of the present disclosure, the center of the glass substrate 3 may be aligned with that of the machine table 1. In the meanwhile, the developing liquid sprayed by the nozzle 2 needs to cover the whole glass substrate 3 such that the developing liquid can be sprayed onto the glass substrate 3 uniformly. That is, a plurality of nozzles 2 may be provided in the embodiment of the present disclosure.

In order to realize the inclination control of the machine table 1 and the nozzle 2, in an alternative embodiment, as shown in FIG. 5, the inclination controller may specifically include a telescopic member 5 connected with the nozzle 2 and the machine table 1, respectively.

In this way, due to the telescopic movement of the telescopic member 5, it is able to simultaneously drive the nozzle 5 and the machine table 1 as a whole to be inclined toward a predetermined direction of the machine table 1 at the predetermined angle, thereby to enable them to keep the inclined angle within a preset period.

In a preferred embodiment, the developing device of the disclosure may be specifically provided with four telescopic members 5 as shown in FIG. 5, which are connected with the nozzle 2 and the machine table 1 at preset positions, respectively, for example, at corners of the nozzle 2 and the machine table 1. As a result, it is able to facilitate the inclination control over the nozzle 2 and the machine table 1.

Figure 6:
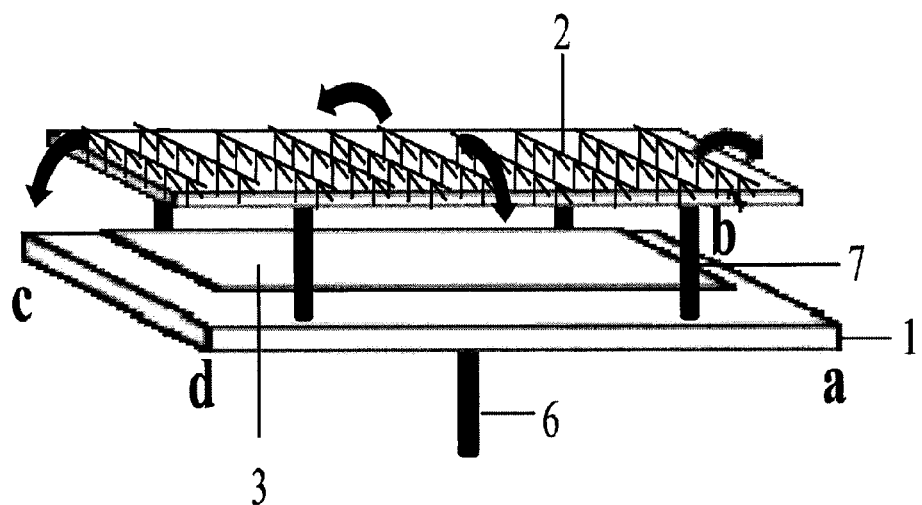
FIG. 6 is another schematic view showing the structure of a developing device according to an embodiment of the present disclosure.

In another alternative embodiment, as shown in FIG. 6, the inclination controller may specifically include a swinging member 6 fixedly connected with the machine table 1.

In this way, due to the swinging movement of the swinging member 6 toward the respective directions of the machine table 1, it is able to control the machine table 1 to be inclined toward the respective direction at the predetermined angle, and to control the machine table 1 to keep the inclined angle at a preset period.

In the meanwhile, the nozzle 2 may be fixedly connected with the machine table 1 via at least one connection member 7 in this embodiment, so as to control the inclination of them simultaneously as a whole.

Moreover, the inclination controller in the present disclosure may control the inclination of the machine table 1 and the nozzle 2 in any other ways.

In addition to the above-mentioned members, the developing device as provided in the disclosure may further include members capable of ensuring its normal operation, such as a motor and a developing trough.

Figure 7:
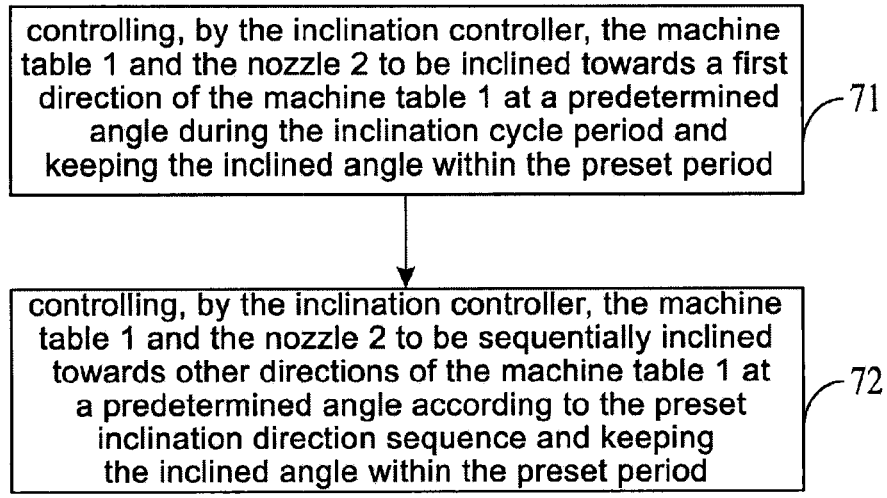
FIG. 7 is a flow chart of a developing method according to an embodiment of the present disclosure.

Moreover, the embodiment of the disclosure further provides a developing method. As shown in FIG. 7, the method may specifically include:

Step 71: controlling, by the inclination controller, the machine table 1 and the nozzle 2 to be inclined toward a first direction of the machine table 1 at a predetermined angle θ during an inclination cycle period, and keeping the inclined angle within a preset period; and Step 72: controlling, by the inclination controller, the machine table 1 and the nozzle 2 to be sequentially inclined toward other directions of the machine table 1 at a predetermined angle according to a preset inclination direction sequence, and keeping the inclined angle within a preset period.

According to the developing method provided in the embodiment of the present disclosure, the inclination controller controls the machine table 1 to drive the developing liquid nozzle 2 and the glass substrate 3 to be inclined and swung toward respective directions of the machine table 1 (for example, directions towards its four sides) with its center (or the center of the glass substrate 3) as a reference in a certain inclination cycle period, so as to complete the development. According to the developing method, it is able to ensure the consistent concentration of the developing liquid contacted by each part of the glass substrate 3, thereby to improve the line width uniformity after the development.

In the embodiment of the present disclosure, the inclination cycle period may be set according to process requirements, for example, the developing time of a photoresist.

Meanwhile, the inclination direction sequence in the embodiment of the present disclosure may be a clockwise direction, a counter-clockwise direction, a sequence of a front-to-back direction first and then a left-to-right direction, or a sequence of the left-to-right direction first and then the front-to-back direction, as long as the machine table 1 can be inclined in the respective directions.

Furthermore, in the embodiment of the present disclosure, the nozzle 2 may continuously spray the developing liquid during the inclination cycle period. For saving the cost, the nozzle 2 may also intermittently spray the developing liquid. For example, only when the inclination controller controls the nozzle 2 and machine table 1 to be inclined at a certain angle, the spraying is started, and when the nozzle 2 and the machine table 1 are inclined toward the other direction, the spraying may be stopped.

For ease of understanding the technical solution as provided in the embodiment of the present disclosure, description will be given below in details by applying the developing method to the developing device as shown in FIG. 6.

During the development, the machine table 1 drives the glass substrate 3 and the nozzle 2 to be inclined and swung in a direction toward its four sides in turn at a certain angle (θ, as shown in FIGS. 8-11.

Figure 8:
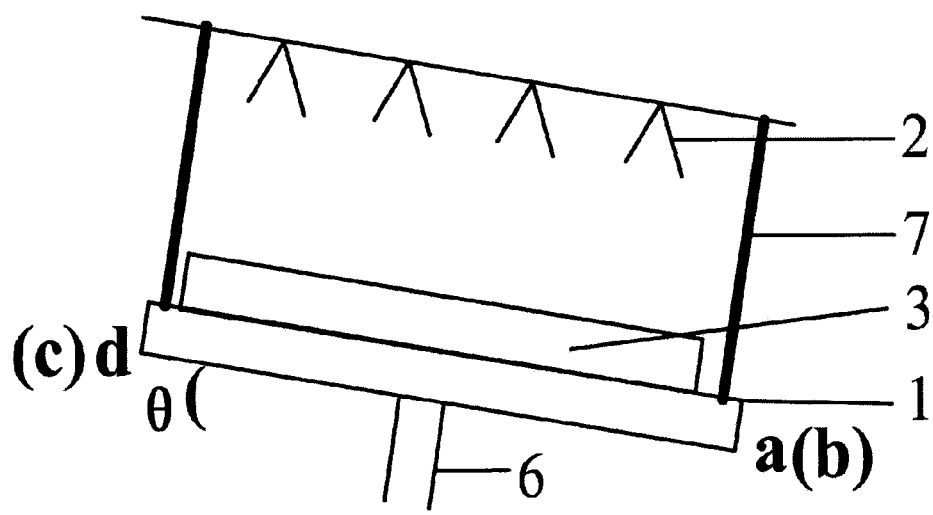
FIG. 8 is a schematic view showing the implementation of the developing method according to an embodiment of the present disclosure.

Firstly, as shown in FIG. 8, the inclination controller controls the machine table 1 and the nozzle 2 to be inclined toward a direction where side a-b of the machine table 1 is situated, i.e., the side a-b of the machine table 1 is inclined downward and the developing liquid contacted by the glass substrate in this direction has a lower concentration. Side c-d of the machine table 1 is inclined upward, and the developing liquid contacted by the glass substrate in this direction is a new liquid. This posture of developing is kept for a certain period of time.

It should be appreciated that, in the embodiment of the present disclosure, the inclination controller controls the time for keeping the inclination posture after the machine table 1 and the nozzle 2 have been included toward the respective directions; namely, the developing time may be either the same or different. which may be set according to the practical needs. Similarly, the inclined angles in the respective directions may be either the same or different.

Corresponding to the developing device as shown in FIG. 5, two telescopic members 5 provided at side a-b may be controlled to move downward and two telescopic members 5 provided at side c-d may be controlled to move upward, so that the side a-b of the machine table 1 is inclined downward and the side c-d thereof is inclined upward. Alternatively, two telescopic members 5 provided at the side a-b may be controlled separately to move downward, so that the side a-b of machine table 1 is included downward and side c-d thereof is inclined upward.

Corresponding to the developing device as shown in FIG. 6, the swinging member 6 may be controlled to be swung towards the direction where side a-b of the machine table 1 is situated, so that the side a-b thereof is inclined downward and side c-d thereof is inclined upward, as shown in FIG. 8.

Figure 9:
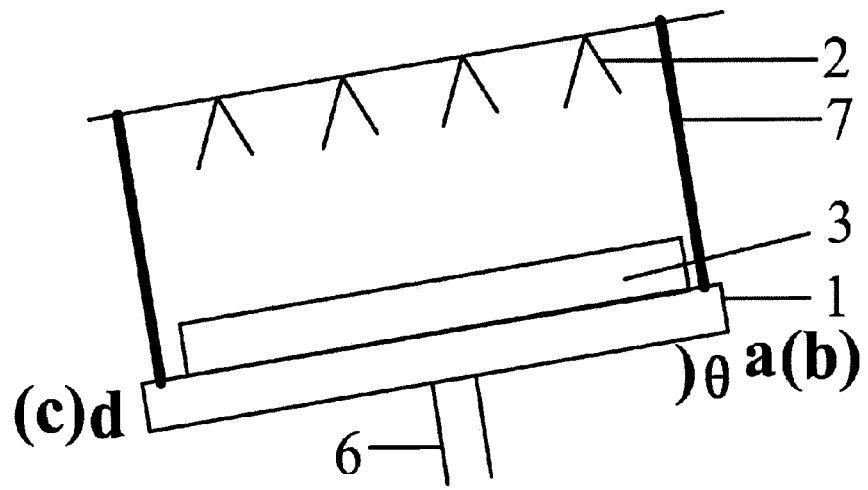
FIG. 9 is another schematic view showing the implementation of the developing method according to an embodiment of the present disclosure.
Figure 10:
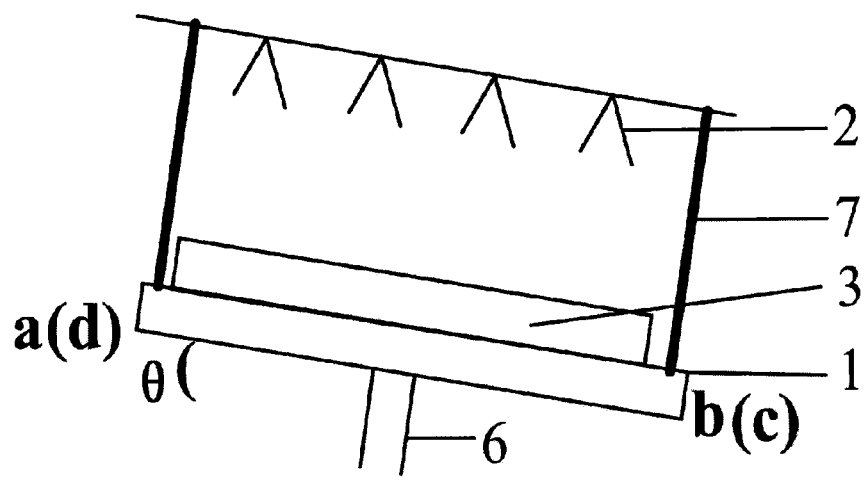
FIG. 10 is yet another schematic view showing the implementation of the developing method according to an embodiment of the present disclosure.
Figure 11:
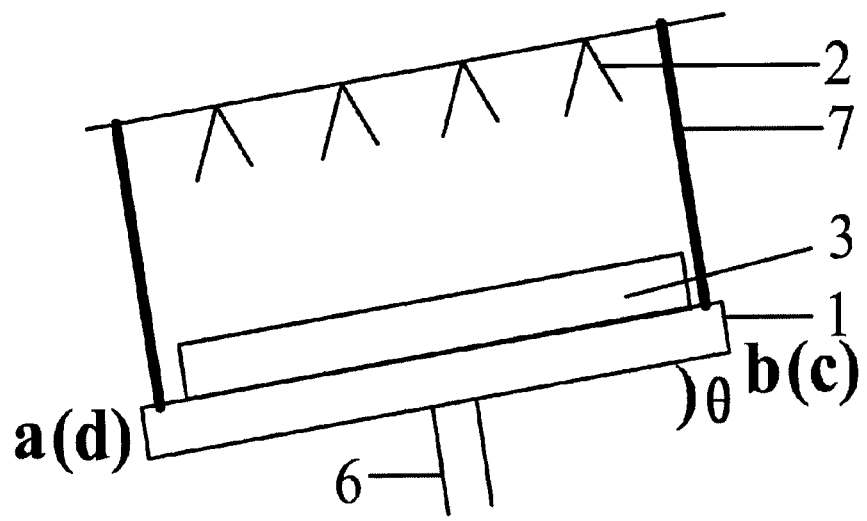
FIG. 11 is still yet another schematic view showing the implementation of the developing method according to an embodiment of the present disclosure.

In following steps, as shown in FIGS. 9-11, the procedure of controlling the machine table 1 and the nozzle 2 to be inclined by the inclination controller is similar to that described above, which will be not repeated herein.

Subsequently, as shown in FIG. 9, the inclination controller controls the machine table 1 and the nozzle 2 to be inclined toward a direction where side c-d of the machine table 1 is situated. i.e., the side c-d of the machine table 1 is inclined downward, and the developing liquid contacted by the glass substrate in this direction has a lower concentration. Side a-b of the machine table 1 is inclined upward, and the developing liquid contacted by glass in this direction is a new liquid. This posture of developing is kept for a certain period of time.

Next, as shown in FIG. 10, the inclination controller controls the machine table 1 and the nozzle 2 to be inclined toward a direction where side b-c of the machine table 1 is situated, i.e., the side b-c of the machine table 1 is inclined downward, and the developing liquid contacted by the glass substrate in this direction has a lower concentration. Side a-b of the machine table 1 is inclined upward, and the developing liquid contacted by glass in this direction is a new liquid. This posture of developing is kept for a certain period of time.

Finally, as shown in FIG. 11, the inclination controller controls the machine table 1 and the nozzle 2 to be inclined toward a direction where side a-d of the machine table 1 is situated, i.e., the side a-d of the machine table 1 is inclined downward, and the developing liquid contacted by the glass substrate in this direction has a lower concentration. Side b-c of the machine table 1 is inclined upward, and the developing liquid contacted by glass in this direction is a new liquid. This posture of developing is kept for a certain period of time.

So far, a developing cycle, an inclination cycle period, has been completed.

In accordance with the process requirements, the above-described cycle may be performed many times for the development.

Figure 12:
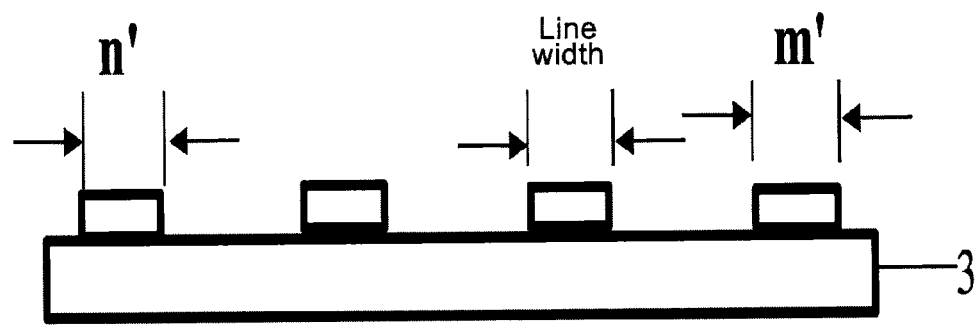
FIG. 12 is schematic view showing the implementation result of the developing method according to an embodiment of the present disclosure.

Therefore, it is able to ensure the consistent concentration of the developing liquid contacted by the glass substrate 3 in the respective directions, thereby to improve the line width uniformity after the development. As shown in FIG. 12, line width m' and n' in the substrate 3 produced by using the developing method in the embodiment of the disclosure are substantially the same.

Moreover, according to the developing method provided in the embodiment of the disclosure, it is able to develop the thin film glass substrate 3 in one developing trough.

For some production lines at a fast speed, multiple developing devices in the embodiment of the disclosure may be provided to speed up the production. Each of the glass substrates 3 may be directly transferred to a downstream cleaning unit after the development in one of the developing devices.

As can be known from the description above, according to the embodiments of the present disclosure, the developing device includes the nozzle for spraying the developing liquid, the machine table for bearing the glass substrate, and the inclination controller for controlling the nozzle and the machine table to be inclined towards a predetermined direction of the machine table at a predetermined angle and keeping the inclined angle within a preset period. The developing method includes controlling, by the inclination controller, the machine table and the nozzle to be inclined towards a first direction of the machine table at a predetermined angle during the inclination cycle period and keeping the inclined angle within the preset period, and controlling, by the inclination controller, the machine table and the nozzle to be sequentially inclined towards other directions of the machine table at a predetermined angle according to the preset inclination direction sequence and keeping the inclined angle within the preset period. As a result, it is able to ensure the consistent concentration of the developing liquid contacted by the glass substrate in respective directions, thereby to improve the line width uniformity after the development.

The above are merely the preferred embodiments of the present disclosure. It should be appreciated that, a person skilled in the art may make further modifications and improvements without departing from the principle of the present disclosure, and these modifications and improvements still also fall within the scope of the present disclosure.

What is claimed is:

1. A developing device, comprising:
   a nozzle for spraying a developing liquid;
   a machine table for bearing a glass substrate; and
   an inclination controller that:
      simultaneously inclines the nozzle and the machine table as a whole toward a first direction;
      after inclining the nozzle and the machine table as a whole toward the first direction, keeps each of the nozzle and the machine table tilted at a first predetermined angle for a first preset period;
      sequentially inclines the nozzle and the machine table as a whole toward other directions according to a preset inclination direction sequence; and
      after inclining the nozzle and the machine table as a whole toward each of the other directions, keeps each of the nozzle and the machine table tilted at a second predetermined angle for a second preset period.

2. The developing device according to claim 1, wherein the inclination controller comprises a telescopic member connected with the nozzle and the machine table, respectively.

3. The developing device according to claim 2, wherein the inclination controller comprises four telescopic members connected with the nozzle and the machine table at preset positions, respectively.

4. The developing device according to claim 3, wherein the preset positions are corners of the nozzle and the machine table.

5. The developing device according to claim 1, wherein a center of the glass substrate is aligned with a center of the machine table.

6. The developing device according to claim 1, wherein the inclination controller comprises a swinging member fixedly connected with the machine table.

7. The developing device according to claim 6, wherein the nozzle is fixedly connected with the machine table via a connecting member.

8. The developing device according to claim 2, wherein a center of the glass substrate is aligned with a center of the machine table.

9. The developing device according to claim 3, wherein a center of the glass substrate is aligned with a center of the machine table.

10. The developing device according to claim 4, wherein a center of the glass substrate is aligned with a center of the machine table.

11. The developing device according to claim 1, wherein the second predetermined angle is equal to the first predetermined angle.

12. The developing device according to claim 1, wherein the second preset period is equal to the first preset period.

13. The developing device according to claim 1, wherein the other directions include a second direction that is opposite of the first direction, and a third direction that is different than the first and second direction.

14. The developing device according to claim 13, wherein the third direction is perpendicular to the first and second directions, and the other directions further include a fourth direction that is opposite of the third direction.

* * * * *